(12) United States Patent
Kim

(10) Patent No.: US 11,350,538 B2
(45) Date of Patent: May 31, 2022

(54) COVER COUPLING STRUCTURE FOR HOUSING OF ELECTRONIC APPARATUS

(71) Applicant: Samsung Electronics Co., Ltd., Gyeonggi-do (KR)

(72) Inventor: Eu Gene Kim, Gyeonggi-do (KR)

(73) Assignee: Samsung Electronics Co., Ltd., Gyeonggi-do (KR)

(*) Notice: Subject to any disclaimer, the term of this patent is extended or adjusted under 35 U.S.C. 154(b) by 0 days.

(21) Appl. No.: 16/758,897

(22) PCT Filed: Oct. 26, 2018

(86) PCT No.: PCT/KR2018/012829
§ 371 (c)(1),
(2) Date: Apr. 24, 2020

(87) PCT Pub. No.: WO2019/083322
PCT Pub. Date: May 2, 2019

(65) Prior Publication Data
US 2020/0375052 A1 Nov. 26, 2020

(30) Foreign Application Priority Data
Oct. 26, 2017 (KR) .................. 10-2017-0140346

(51) Int. Cl.
*H05K 5/03* (2006.01)
*H05K 5/02* (2006.01)
*G06F 1/16* (2006.01)

(52) U.S. Cl.
CPC ............. *H05K 5/03* (2013.01); *G06F 1/1616* (2013.01); *H05K 5/0217* (2013.01)

(58) Field of Classification Search
CPC ...... H05K 5/03; H05K 5/0217; G06F 1/1616; G06F 1/1656; G06F 1/181; G06F 1/182
See application file for complete search history.

(56) References Cited

U.S. PATENT DOCUMENTS 5,921,516 A * 7/1999 Ho .................. F16M 13/02
                                                                 248/206.5
6,439,519 B1 * 8/2002 Takamasa .......... A47B 91/00
                                                                 248/188.8

(Continued)

FOREIGN PATENT DOCUMENTS

| JP | 2013-166551 A | 8/2013 |
| KR | 20-0419349 Y1 | 6/2006 |
| KR | 20-2017-0003079 U | 9/2017 |

OTHER PUBLICATIONS

Korean Search Report dated Dec. 15, 2021.

*Primary Examiner* — Anthony M Haughton
*Assistant Examiner* — Theron S Milliser
(74) *Attorney, Agent, or Firm* — Cha & Reiter, LLC

(57) ABSTRACT

The electronic apparatus, according to various embodiments of the present disclosure, comprises a housing defining the exterior of the electronic apparatus, a cover which, with the housing, defines at least part of the exterior of the electronic apparatus, and a coupling structure arranged on the housing and configured to detachably couple the cover to the housing, wherein the coupling structure may comprise an opening, a screw coupling structure located inside the opening, a connection part for connecting the perimeters of the screw coupling structure and the opening, and one or more catching protrusions protruding from the perimeter of the opening towards the screw coupling structure, and wherein the cover may comprise a hook configured to be hooked to the one or more catching protrusions.

14 Claims, 13 Drawing Sheets

(56) References Cited

U.S. PATENT DOCUMENTS

| | | | |
|---|---|---|---|
| 8,985,545 B2* | 3/2015 | Chiu | H05K 5/0234 |
| | | | 248/635 |
| 9,218,020 B1* | 12/2015 | Martinez | G06F 1/1656 |
| 2002/0117590 A1* | 8/2002 | Araki | A47B 91/00 |
| | | | 248/188.8 |
| 2003/0016493 A1* | 1/2003 | Hiratomo | G06F 1/181 |
| | | | 361/679.36 |
| 2006/0131466 A1* | 6/2006 | Cha | D06F 39/125 |
| | | | 248/188.8 |
| 2009/0159411 A1 | 6/2009 | Guo et al. | |
| 2011/0102981 A1* | 5/2011 | Chen | F16M 13/00 |
| | | | 361/679.01 |
| 2011/0297806 A1* | 12/2011 | Park | A47G 1/18 |
| | | | 248/222.14 |
| 2011/0304246 A1* | 12/2011 | Taniguchi | H05K 5/0017 |
| | | | 312/223.1 |
| 2012/0118773 A1* | 5/2012 | Rayner | H05K 5/0004 |
| | | | 206/320 |
| 2013/0047773 A1 | 2/2013 | Tomaru et al. | |
| 2013/0075550 A1* | 3/2013 | Chiu | G06F 1/181 |
| | | | 248/188.9 |

* cited by examiner

US 11,350,538 B2

COVER COUPLING STRUCTURE FOR HOUSING OF ELECTRONIC APPARATUS

CLAIM OF PRIORITY

This application is a National Phase Entry of PCT International Application No. PCT/KR2018/012829, which was filed on Oct. 26, 2018, and claims a priority to Korean Patent Application No. 10-2017-0140346, which was filed on Oct. 26, 2017, the contents of which are incorporated herein by reference.

TECHNICAL FIELD

Various embodiments of the disclosure relate to a cover coupling structure for a housing of an electronic apparatus, for example, to a coupling structure that can separate a cover and a housing of an electronic apparatus.

BACKGROUND ART

In general, electronic apparatuses such as a desktop or laptop computer may include various electronic parts corresponding to the variety of the functions. It is possible to disassemble the housing of electronic apparatuses, for example, using screw joints to replace or repair various electronic parts.

DISCLOSURE OF INVENTION

Technical Problem

Screws exposed through the outer surface of a housing may be aesthetic drawbacks of the housing and electronic apparatuses. An electronic apparatus may further include an external component configured to hide screws from the outside, for example, a cover or a supporter to compensate for the aesthetic drawbacks. Such a cover or supporter may be coupled to be detachable from the housing in preparation for when the electronic apparatus needs to be disassembled Accordingly, an electronic apparatus according to various embodiments of the disclosure may provide a cover coupling structure that can be detachably coupled to a housing.

Solution to Problem

An electronic apparatus according to various embodiments of the disclosure may include: a housing configured to define an external appearance of the electronic apparatus; a cover configured to define at least a portion of the external appearance of the electronic apparatus in cooperation with the housing; and a coupling structure disposed on the housing and configured to detachably fasten the cover to the housing, wherein the coupling structure has: an opening; a thread-fastening portion positioned at a center of the opening; a bridge connecting the thread-fastening portion and a perimeter of the opening; and at least one catching protrusion protruding toward the thread-fastening portion from the perimeter of the opening, wherein the cover may have a hook configured to be caught on the at least one catching protrusion An electronic apparatus according to various embodiments of the disclosure may include: a printed circuit board; a front housing and rear housing configured to define an inner space in which the printed circuit board is mounted; and at least one coupling structure configured to couple the front housing and the rear housing, in which the coupling structure has a indentation formed in a substantially circular shape on the rear housing; a through-hole positioned inside the indentation; at least one opening formed along a perimeter of the indentation; and at least one catching protrusion protruding from the perimeter of the indentation toward the at least one opening, and has: a screw passing through the through-hole and configured to fix the front housing and the rear housing by being fastened to a tapped hole positioned to correspond to the through-hole in the front housing; and a hook configured to be detachably engaged with the at least one catching protrusion.

Advantageous Effects of Invention

According to various embodiments of the disclosure, the cover is fastened to the coupling structure having a thread-fastening portion to cover the screw, whereby it is possible to provide aesthetic satisfaction to the electronic apparatus. The cover can be easily fastened to the coupling structure of a housing regardless of the assembly direction. Since the bridge and the protrusion do not overlap each other, it is possible to simplify the manufacturing process of the coupling structure without an additional process for forming a protrusion.

BEST MODE FOR CARRYING OUT THE INVENTION

Figure 1:
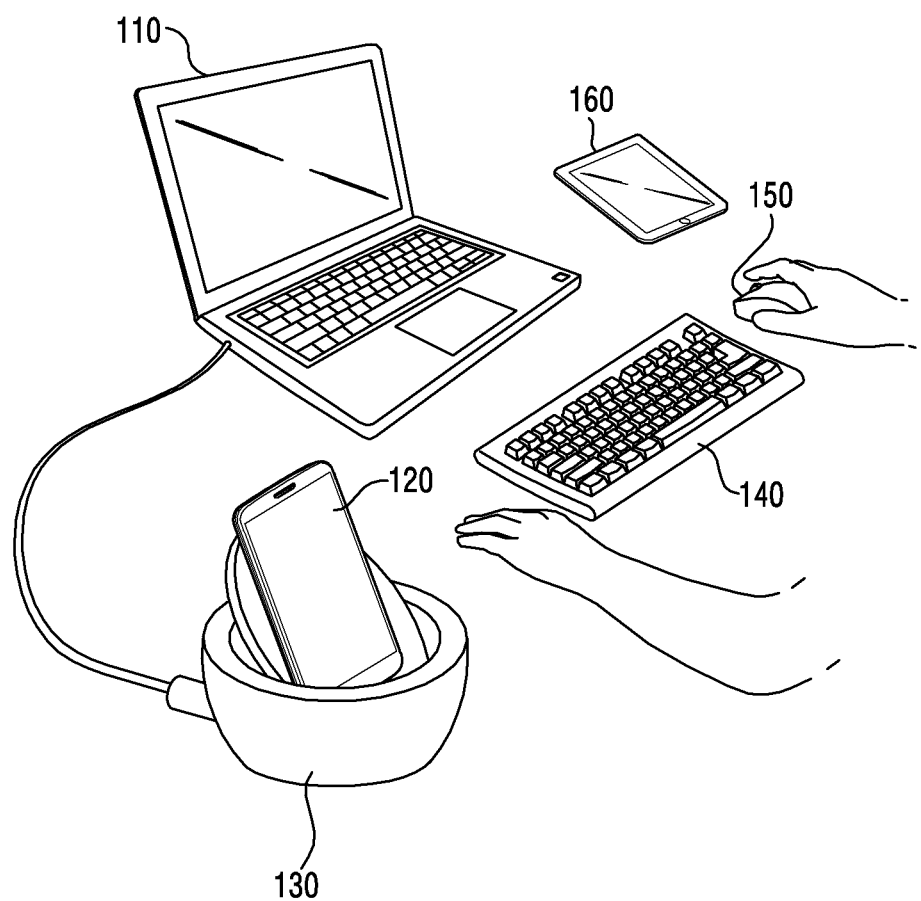
FIG. 1 is a diagram showing an embodiment of electronic apparatuses to which a coupling structure according to various embodiments of the disclosure can be applied.

Embodiments of the present disclosure are described herein below with reference to the accompanying drawings.

However, the embodiments of the present disclosure are not limited to the embodiments and should be construed as including all modifications, changes, equivalent devices and methods, and/or alternative embodiments of the present disclosure. In the description below of the accompanying drawings, similar reference numerals are used for similar elements.

As used herein, the expression "have", "may have", "include", or "may include" refers to the existence of a corresponding feature (e.g., numeral, function, operation, or constituent element such as component), and does not exclude one or more additional features.

In the present disclosure, the expression "A or B", "at least one of A or/and B", or "one or more of A or/and B" may include all possible combinations of the items listed. For example, the expression "A or B", "at least one of A and B", or "at least one of A or B" refers to all of (1) including at least one A, (2) including at least one B, or (3) including both at least one A and at least one B.

The expression "a first", "a second", "the first", or "the second" used in various embodiments of the present disclosure may modify various components regardless of the order and/or the importance but does not limit the corresponding components. For example, a first user device and a second user device indicate different user devices although both of them are user devices. For example, a first element may be termed a second element, and similarly, a second element may be termed a first element without departing from the scope of the present disclosure.

It should be understood that when an element (e.g., first element) is referred to as being (operatively or communicatively) "connected," or "coupled," to another element (e.g., second element), it may be directly connected or coupled directly to the other element or any other element (e.g., third element) may be interposer between them. In contrast, it may be understood that when an element (e.g., first element) is referred to as being "directly connected," or "directly coupled" to another element (second element), there are no element (e.g., third element) interposed between them.

The expression "configured to" used in the present disclosure may be exchanged with, for example, "suitable for", "having the capacity to", "designed to", "adapted to", "made to", or "capable of" according to the situation. The term "configured to" may not necessarily imply "specifically designed to" in hardware. Alternatively, in some situations, the expression "device configured to" may mean that the device, together with other devices or components, "is able to". For example, the phrase "processor adapted (or configured) to perform A, B, and C" may mean a dedicated processor (e.g. embedded processor) only for performing the corresponding operations or a generic-purpose processor (e.g., central processing unit (CPU) or application processor (AP)) that can perform the corresponding operations by executing one or more software programs stored in a memory device.

The terms used herein are merely for the purpose of describing particular embodiments and are not intended to limit the scope of other embodiments. As used herein, singular forms may include plural forms as well unless the context clearly indicates otherwise. Unless defined otherwise, all terms used herein, including technical and scientific terms, have the same meaning as those commonly understood by a person skilled in the art to which the present disclosure pertains. Such terms as those defined in a generally used dictionary may be interpreted to have the meanings equal to the contextual meanings in the relevant field of art, and are not to be interpreted to have ideal or excessively formal meanings unless clearly defined in the present disclosure. In some cases, even the term defined in the present disclosure should not be interpreted to exclude embodiments of the present disclosure.

An electronic device according to the embodiments of the present disclosure may include at least one of a smartphone, a tablet personal computer (PC), a mobile phone, a video phone, an electronic book reader, a desktop PC, a laptop PC, a netbook computer, a workstation, a server, a personal digital assistant (PDA), a portable multimedia player (PMP), a moving picture experts group audio layer 3 (MP3) player, a mobile medical machine, a camera, or a wearable device (for example, smart glasses, a head-mounted-device (HMD), electronic clothing, an electronic bracelet, an electronic necklace, an electronic appcessory, electronic tattoos, a smart mirror, or a smart watch)

According to some embodiments, the electronic device may be a home appliance. The home appliance may include at least one of, for example, a television, a Digital Video Disk (DVD) player, an audio, a refrigerator, an air conditioner, a vacuum cleaner, an oven, a microwave oven, a washing machine, an air cleaner, a set-top box, a home automation control panel, a security control panel, a TV box (e.g., Samsung HomeSync™, Apple TV™, or Google TV™), a game console (e.g., Xbox™ and PlayStation™), an electronic dictionary, an electronic key, a camcorder, and an electronic photo frame.

According to another embodiment, the electronic device may include at least one of various medical devices (e.g., various portable medical measuring devices (a blood glucose monitoring device, a heart rate monitoring device, a blood pressure measuring device, a body temperature measuring device, etc.), a Magnetic Resonance Angiography (MRA), a Magnetic Resonance Imaging (MRI), a Computed Tomography (CT) machine, and an ultrasonic machine), a navigation device, a Global Positioning System (GPS) receiver, an Event Data Recorder (EDR), a Flight Data Recorder (FDR), a Vehicle Infotainment Devices, an electronic devices for a ship (e.g., a navigation device for a ship, and a gyro-compass), avionics, security devices, an automotive head unit, a robot for home or industry, an automatic teller's machine (ATM) in banks, point of sales (POS) in a shop, or internet device of things (e.g., a light bulb, various sensors, electric or gas meter, a sprinkler device, a fire alarm, a thermostat, a streetlamp, a toaster, a sporting goods, a hot water tank, a heater, a boiler, etc.).

According to some embodiments, the electronic device may include at least one of a part of furniture or a building/structure, an electronic board, an electronic signature receiving device, a projector, and various kinds of measuring instruments (e.g., a water meter, an electric meter, a gas meter, and a radio wave meter). The electronic device according to various embodiments of the present disclosure may be a combination of one or more of the aforementioned various devices. The electronic device according to some embodiments of the present disclosure may be a flexible device. Further, the electronic device according to an embodiment of the present disclosure is not limited to the aforementioned devices, and may include a new electronic device according to the development of technology.

The term "module" as used herein includes a unit that includes hardware, software, or firmware and may be used interchangeably with the term, for example, "logic", "logical block, or "circuit". The "module" may be an integrated part, or a minimum unit for performing one or more functions or a part thereof. The "module" may be mechanically or electronically implemented and may include, for example, an application-specific integrated circuit (ASIC) chip, a field-programmable gate arrays (FPGA), or a programmable-logic device, which has been known or are to be developed in the future, for performing certain operations.

FIG. 1 is a diagram showing an embodiment of electronic apparatuses to which a coupling structure according to various embodiments of the disclosure can be applied. Referring to FIG. 1, in general, a laptop computer 110 can be used on the ground or a desk. Electronic apparatuses, such as docking station 130 for charging a smartphone 120 or applying miracast to the smartphone 120, a keyboard 140, and a mouse 150, can also be used on the ground or a desk. Portable electronic apparatuses such as a smartphone 120 or a tablet 160 can also be used on the ground or a desk, if necessary.

These electronic apparatuses, generally, may include a supporter (or a cover) disposed on the bottom of a housing for anti-slip or vibration-isolation. A supporter is made of an elastic material (e.g., rubber and sponge foam), thereby being able to provide a friction force and prevent sliding of the floor. A supporter made of an elastic material is deformable, so it can absorb shock and protect electronic apparatuses. Further, a supporter spaces electronic apparatuses a predetermined gap from the floor, so it is possible to improve the heat dissipation rate of the electronic apparatuses.

The laptop computer 110 shown in FIG. 1 may be representatively described in various embodiments described herein and shown in the figures. However, this only provides a specific embodiment to easily describe the technical spirit of the disclosure and help understanding the disclosure and does not limit the scope of the disclosure. Therefore, other than the embodiments described herein, all of changes or modifications based on the spirit of the disclosure should be construed as being included in the scope of the disclosure.

Figure 2:
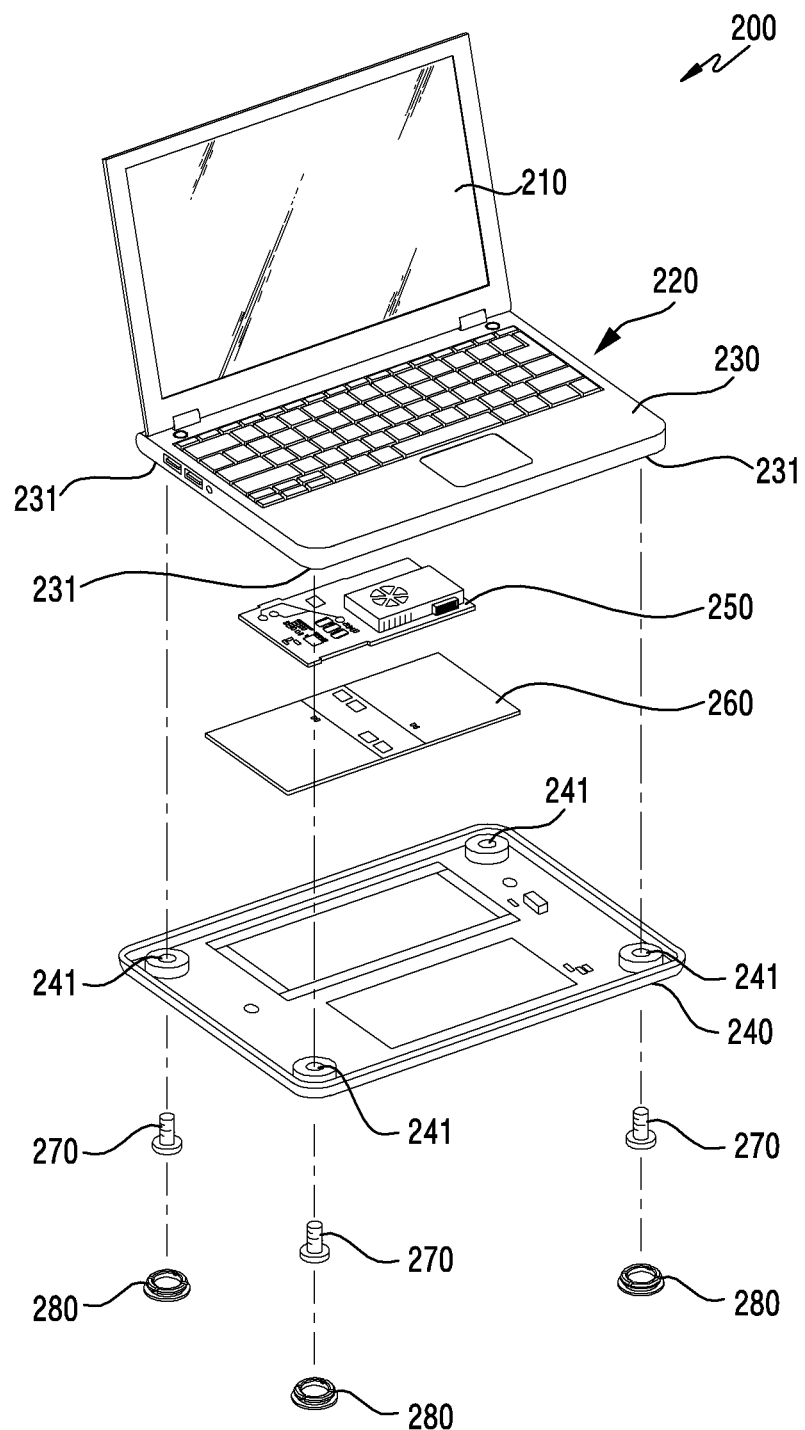
FIG. 2 is an exploded perspective view of an electronic apparatus including a coupling structure according to various embodiments of the disclosure.

FIG. 2 is an exploded perspective view of an electronic apparatus including a coupling structure according to various embodiments of the disclosure. Referring to FIG. 2, an electronic apparatus 200 may include a display 210 and a main body 220 pivotally coupled to the display 210. The main body 220 may include a first housing 230, a second housing 240, a printed circuit board 250, and a battery 260. The first housing 230 and the second housing 240 can define the external appearance and an inner space of the electronic apparatus 200 (or the main body 220). The inner space can accommodate or secure the printed circuit board 250 and the battery 260

According to an embodiment, a processor, a memory, and/or an interface may be mounted (or disposed) on the printed circuit board 250. The processor, for example, may include one or more of a CPU, at least one graphic processor, an image signal processor, a sensor hub processor, or a communication processor. The memory, for example, may include a volatile memory or a nonvolatile memory. The interface may include a High Definition Multimedia Interface (HDMI), a Universal Serial Bus (USB) interface, an SD card interface, and/or an audio interface. The interface, for example, can electrically or physically connect the electronic apparatus 200 to external electronic apparatuses and may include an USB connector, an SD card/MMC connector, or an audio connector.

According to an embodiment, the battery 260, which is a device for supplying power to one or more components of the electronic apparatus 200, for example, may include a primary battery that is not rechargeable, a secondary battery that is rechargeable, or a fuel cell. The battery 260 may be, for example, disposed under the printed circuit board 250. As another example, the battery 260 may be disposed in substantially the same plane as the printed circuit board 250. The battery 260 may be integrally disposed in the electronic apparatus 200 and may be configured detachably from the electronic apparatus 200.

According to an embodiment, the first housing 230 and the second housing 240 of the main body 220 can be detachably assembled. For example, the first housing 230 and the second housing 240 may be assembled by securing their edges through bonding, snap-fitting, or other methods. According to an embodiment, the assembly of the first housing 230 and the second housing 240 may be maintained by screw joint (or bolting). According to an embodiment, the second housing 240 may have through-holes 241 for screw joint at at least some positions. The first housing 230 may have tapped holes 231 (or female threads) at positions corresponding to the through-hole 241. Screws 270 (or male screws) are fastened to the tapped holes 231 through the through-holes 241, thereby being able to fix the first housing 230 and the second housing 240

According to an embodiment, a cover 280 can prevent exposure of the screw 270 to the outside from the electronic apparatus 200. The cover 280 can be detachably coupled at a position, which corresponds to the screw 270, on the outer surface of the second housing 240. When it is required to disassemble the electronic apparatus 200 (or the main body 220), it is possible to disassemble the first housing 230 and the second housing 240 by separating the cover 280 and then loosening the screw 270 exposed to the outside.

According to an embodiment, the cover 280 may have a shape protruding a predetermined distance outward from the electronic apparatus 200 (or the second housing 240). Accordingly, the cover 280 can prevent direct contact with a floor or a desk of the electronic apparatus 200 (or the second housing 240) and can improve the heat dissipation rate of the electronic apparatus 200.

According to an embodiment, the tapped hole 231 may be made of a material having high strength such as stainless steel to reinforcing the threads. The tapped hole 231 may be formed integrally with the first housing 230 by double-shot injection molding or may be separately formed and then fixed to the first housing 230

Figure 3:
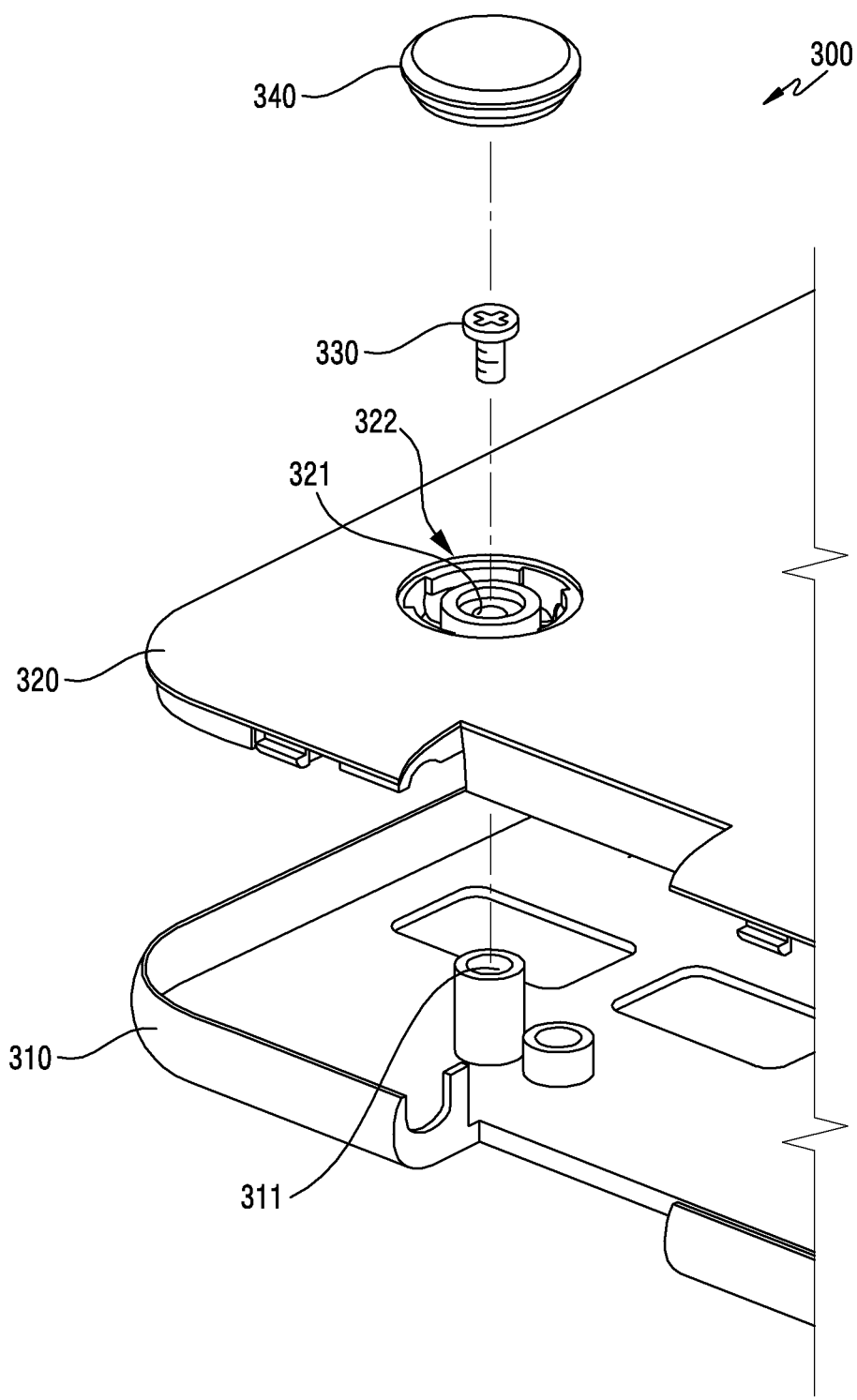
FIG. 3 is a partial exploded perspective view of the electronic apparatus including the coupling structure according to various embodiments of the disclosure.
Figure 4:
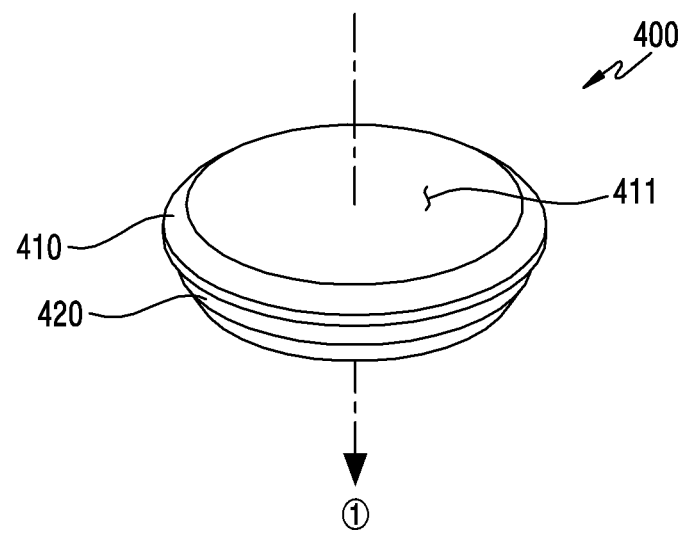
FIG. 4 is a front perspective view, a rear perspective view, and cross-sectional view of a cover according to various embodiments of the disclosure.
Figure 4:
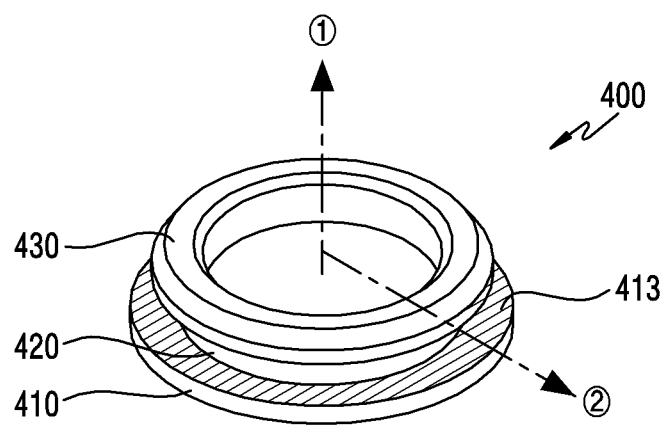
Figure 4:
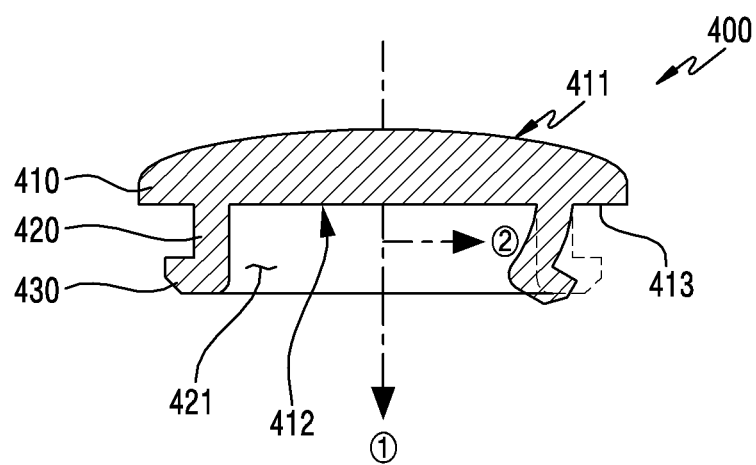

FIG. 3 is a partial exploded perspective view of the electronic apparatus including the coupling structure according to various embodiments of the disclosure. FIG. 3 may be a view showing a portion of the electronic device 200 shown in FIG. 2, which is an example of the disclosure, from under the portion Referring to FIG. 3, the first housing 310 and the second housing 320 of the electronic apparatus 300 may be fixed by a screw 330. According to an embodiment, the first housing 1 may have at least one tapped hole 311. The second housing 320 may have a through-hole 321 at a position corresponding to the tapped hole 311. The screw 330 is fastened to the tapped hole 311 through the through-hole 321, thereby being able to fix the first housing 310 and the second housing 320 not to be disassembled According to an embodiment, a cover 340 can be detachably coupled to the second housing 320 at a position corresponding to the through-hole 321. The second housing 320 may have a coupling structure 322 in which at least a portion of the cover 340 can be accommodated. The coupling structure 322 may be formed around the through-hole 321. The cover 340 can cover the through-hole 321 and the screw 330 to prevent them from being exposed outside when fastened to the coupling structure 322. Accordingly, the cover 340 can compensate for the aesthetic drawbacks due to exposure of the through-hole 321 and the screw 330. When it is required to disassemble the first housing 310 and the second housing 320, it is possible to separating the first housing 310 and the second housing 320 by separate the cover 340 from the coupling structure 322 and then loosening the screw 330. The detailed characteristics of the coupling structure according to various embodiments will be described below According to an embodiment, the cover 340 has a shape protruding a predetermined length outward from the second housing 320 and may be made of an elastic material (e.g., rubber and sponge foam). The cover 340 prevents direct contact of the second housing 320 with a floor or a desk, thereby being able to prevent direct damage to the second housing 320 and improve the heat dissipation rate of the electronic apparatus 300. The cover 340 is deformable, so it can absorb shock and provide an anti-slip and vibration-isolation function to the electronic apparatus 300. Accordingly, the cover 340 may also be referred to as a supporter or an anti-slip pad FIG. 4 is a front perspective view, a rear perspective view, and cross-sectional view of a cover according to various embodiments of the disclosure. A cover 400 shown in FIG. 4 may be, for example, at least partially similar to or the same as the cover 280 shown in FIG. 4 and the cover 340 shown in FIG. 3

Referring to FIG. 4, the cover 400 according to an embodiment may have a head 410, an insert 420, a hook 430. The insert 420 may extend in a first direction θ in which it is inserted in a housing (e.g., the second housing 320 shown in FIG. 3) from the head 410. The hook 430 may at least partially extend in a direction CD facing the outside (perpendicular to the first direction CD) from an end of the insert 420

According to an embodiment, the head 410 may have a first surface 411 (or an outer surface) facing the outside of the housing (e.g., the second housing 320 shown in FIG. 3) in the first direction facing the outside and a second surface 412 (or an inner surface) facing the housing. The insert 420 may be disposed on the second surface 412 of the head 410. According to an embodiment, the head 410 may have a flange 413 formed around the edge of the second surface 412. The flange 413 may be defined as a step portion between the head 410 and the insert 420. The insert 420 may have a substantially cylindrical shape and may define an inner space 421, which can accommodate a screw (e.g., the screw 330 shown in FIG. 3), in cooperation with the head 410. The hook 430 may be formed around the insert 420. According to an embodiment, the insert 420 and the hook 430 of the cover can be bent toward the inner space 421 when the cover 400 is fastened to a coupling structure (e.g., the coupling structure 322 shown in FIG. 3). The cover 400 may be made of an elastic material such as (synthetic) rubber. The cover 400 can be detachably fastened to the coupling structure by bending and restoring of the hook 430. This will be described in detail below.

Figure 5:
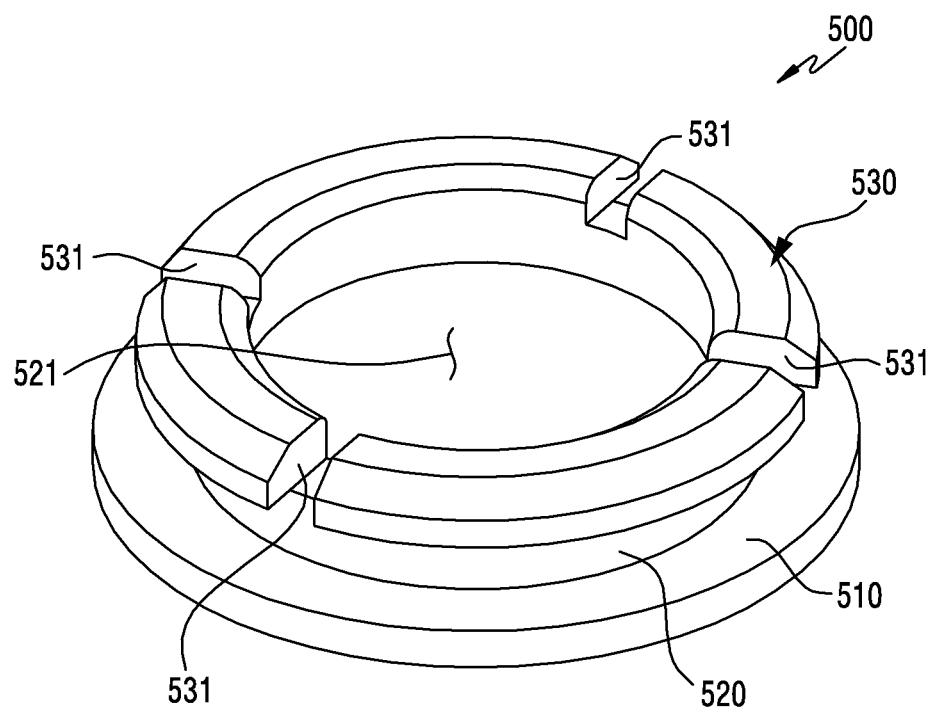
FIG. 5 is a front perspective view showing another example of the cover according to various embodiments of the disclosure.

FIG. 5 is a front perspective view of a cover structure according to another embodiment of the disclosure. A cover 500 shown in FIG. 5 may be at least partially similar to or the same as the cover 400 shown in FIG. 4, so the same configuration is not described.

Referring to FIG. 5, the cover 500 according to various embodiments of the disclosure may have a head 510, an insert 520, a hook 530. The hook 530 may have at least one slit 531 formed around it. According to an embodiment, a plurality of slits 531 may be arranged with regular intervals around the hook 530. The slit 532 can enable the hook 530 to easily bend toward an inner space 521. In an embodiment, four slits 531 may be formed around the hook 530 with regular intervals of 90 degrees around the center of the cover 500. In an embodiment, three slits 531 may be formed around the hook 530 with regular intervals of 120 degrees around the center of the cover 500. An embodiment is not limited thereto and the number and the intervals of the slits 531 may be freely and appropriately determined.

Figure 6:
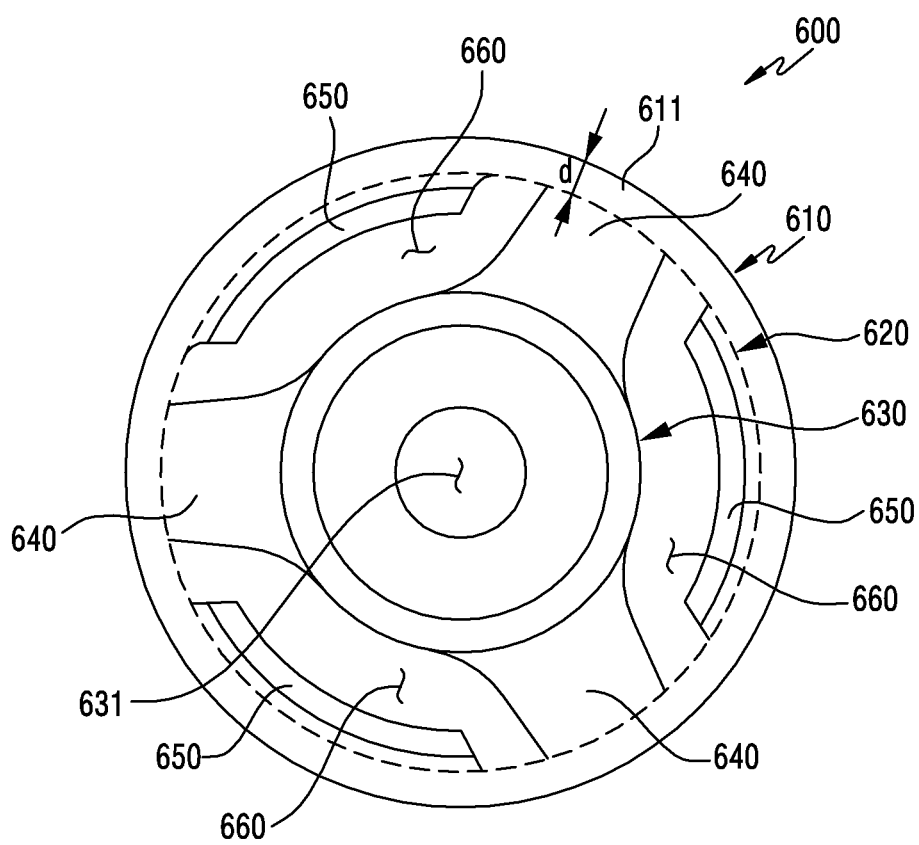
FIG. 6 is a plan view of the coupling structure according to various embodiments of the disclosure.
Figure 7:
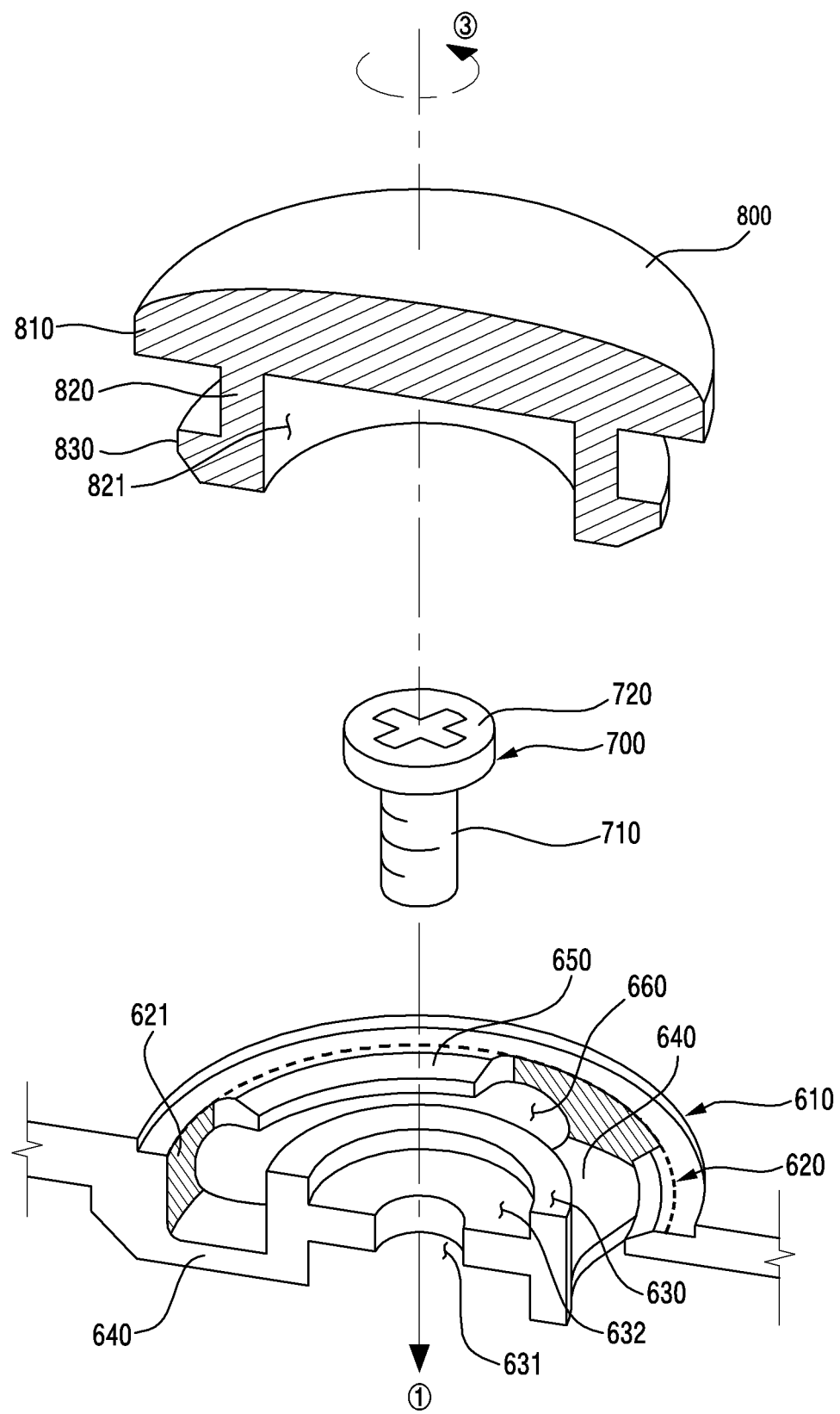
FIG. 7 is a partial cross-sectional perspective view showing the state before a screw and a cover according to various embodiments of the disclosure are fastened to the coupling structure.
Figure 8:
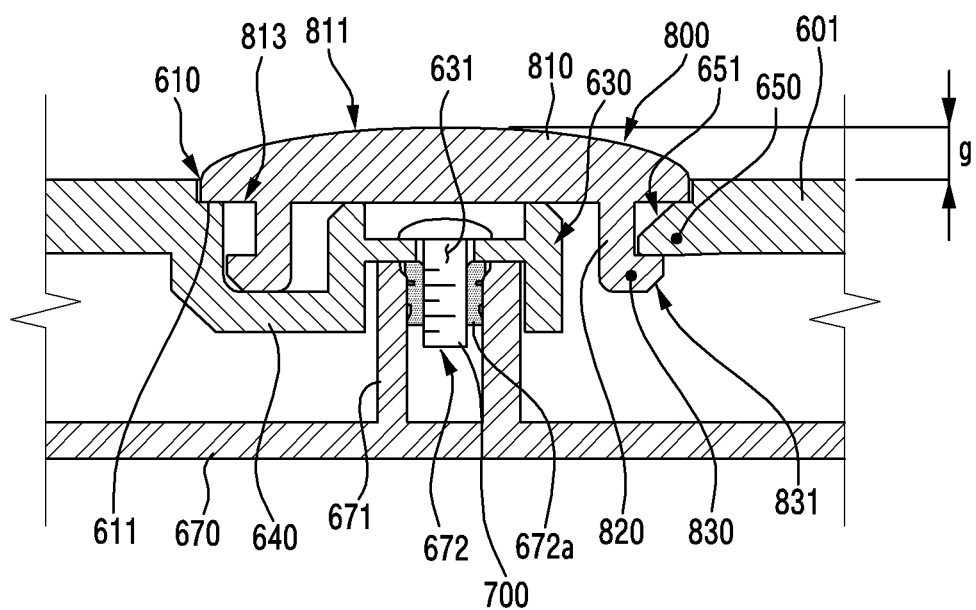
FIG. 8 is a partial cross-sectional perspective view showing the state after a screw and a cover according to various embodiments of the disclosure are fastened to the coupling structure.

FIG. 6 is a plan view of the coupling structure according to various embodiments of the disclosure. FIG. 7 is a partial cross-sectional perspective view showing the state before a screw and a cover according to various embodiments of the disclosure are fastened to the coupling structure. FIG. 8 is a partial cross-sectional perspective view showing the state after a screw and a cover according to various embodiments of the disclosure are fastened to the coupling structure. A coupling structure configured so that a screw and a cover can be fastened is described with reference to FIGS. 6 to 8. A coupling structure 600 shown in FIG. 6 may be at least partially similar to or the same as the coupling structure 322 shown in FIG. 3 and described above.

Referring to FIGS. 6 and 8, the coupling structure 600 according to an embodiment may have an indentation 610, an opening 620, a thread-fastening portion 630, bridges 640, and protrusions 650. The coupling structure 600 may have an indentation 610 at at least a portion of a housing 601 (e.g., the second housing 320 shown in FIG. 3). The opening 620 may be formed within a predetermined width 'd' around the indentation 610. The step between the indentation 610 and the opening 620 may be defined as a step portion 611. The thread-fastening portion 630 may be positioned inside the opening 620. According to an embodiment, the thread-fastening portion 630 may be positioned at the center of the opening 620. The bridges 640 may be formed between the thread-fastening portion 630 and the perimeter surface 621 of the opening 620. The bridges 640 can connect the thread-fastening portion 630 and the housing 601. According to an embodiment, the protrusions 650 may extend toward the thread-fastening portion 630 from the perimeter surface 621 of the opening 620 where the bridges 640 are not disposed. In other words, the protrusions 650 may be formed in an empty areas 660 not overlapping the bridges 640 in the area of the opening 620 when seen from above. According to an embodiment, the indentation 610, the opening 620, the thread-fastening portion 630, the bridges 640, and the protrusions 650 of the coupling structure 600 may be integrally formed.

Referring to FIG. 7, the bridges 640 according to an embodiment may be formed at a substantially lower end of the perimeter surface 621 of the opening 620 and the protrusions 650 may be formed at a substantially upper end of the perimeter surface 621 of the opening 620. The protrusions 650 may be disposed above the bridges 640 on the perimeter surface 621. In other words, the bridges 640 and the protrusions 650 may not overlap each other on the perimeter surface 621 when seen from a side. Referring to FIG. 8 that is a cross-sectional view taken across the center of the thread-fastening portion 630, it can be seen that the bridges 640 and the protrusions 650 are not disposed together on the perimeter surface 621 of the opening 620.

Referring to FIGS. 7 and 8, the housing 601 having the coupling structure 600 according to an embodiment and a counterpart 670 can be fixed by a screw 700. According to an embodiment, the thread-fastening portion 630 may have a through-hole 631 at substantially the center. A shaft 710 having threads of the screw 700 can be inserted through the through-hole 631. The shaft 710 can be fastened in a tapped hole 672 formed in the counterpart 670 through the through-hole 631. The counterpart 670 may be a counter-housing (e.g., the first housing 310 shown in FIG. 3) that can be assembled with the housing 601. For example, the counterpart 670 may be a printed circuit board (e.g., 250 in FIG. 2) or an inner bracket. According to an embodiment, the counterpart 670 may include a certain appropriate part that needs to be fixed to the housing 601.

The counter part 670 (or the counter-housing) may have a column 671 for compensating for the height difference between the housing 601 and the coupling structure 600. The tapped hole 672 may be formed in the column 671. According to an embodiment, a separate tapped hole member 672a may be made of a material having high strength such as a stainless steel to reinforce the threads and may be separately formed to have the tapped hole 672. The separately formed tapped hole member 672a may be fixed in the column 671

According to an embodiment, thread-fastening portion 630 may have a recess 632 in which the head 720 of the screw 700 can be seated. In another embodiment, the recess 632 in which the head 720 of the screw 700 can be seat may be formed on the inner surface (e.g., 412 in FIG. 4) of the head 810 of the cover 800.

According to an embodiment, the cover 800 can be detachably coupled to the coupling structure 600. The cover 800 can be fastened to the coupling structure 600 by accommodating the screw 700 and the thread-fastening portion 630 in the inner space 821 and catching the hook 830 on the protrusion 650. Accordingly, the protrusion 650 may be referred to as a catching protrusion or a coupling protrusion. The hook 830 can be bent inward by the protrusion 650 when the cover 800 start to be inserted. When the cover 800 is fully inserted, the hook 830 returns to the original form, so the hook 830 can be caught on the bottom (or the undercut) of the protrusion 650. Since the hook 830 is caught on the protrusion 650, the cover 800 cannot be easily separated from the coupling structure 600. However, when a force is applied such that the hook 830 can be bent back in the separation direction of the cover 800, the hook 830 is separated from the protrusion 650, so the cover 800 can be separated from the coupling structure 600. That is, the coupling structure 600 can provide a coupling structure that enables the cover 800 to be detachably fastened. The fastening of the hook 830 and the protrusion 650 may be referred to as a snap-fit joint. In other words, the coupling structure 600 may be referred to as a snap-fit joint.

According to an embodiment, the hook 830 and the protrusion 650 may have chamfers 831 and 651 in directions that face each other when they are fastened to each other. The chamfers 831 and 651 can enable the hook 830 to easily bend in fastening.

According to an embodiment, the opening 620 and the thread-fastening portion 630 of the coupling structure 600 may be formed substantially in circular shapes. The insert 820 of the cover 800 that is fastened to the coupling structure 600 may be formed in a shape (e.g., cylindrical shape) that can be inserted in the opening 620 while surrounding the thread-fastening portion 630. The protrusion 650 is disposed around the perimeter surface 621 of the substantially circular opening 620, a user can assemble the cover 800 to the coupling structure 600 regardless of which protrusion the hook 830 has to be caught on. According to an embodiment, the outer shape of the head 810 of the cover 800 may also be formed in a substantially circular shape. Accordingly, a user can assemble the cover 800 to the coupling structure 600 even without a specific mark showing the coupling direction on the head 810. That is, the cover 800 can be fastened to the coupling structure 600 regardless of the direction CD. In other words, the opening 620, the thread-fastening portion 630, the insert 820, and/or the head 810 of the cover 800 in the coupling structure 600 have substantially circular shapes, so the cover 800 can be non-directionally fastened. According to an embodiment, the 'substantially circular shape' may include not only a complete circle, but also polygons over pentagon. According to another embodiment, the only one of the coupling structure 600 and the cover 800 may have a substantially circular shape. According to another embodiment, the coupling structure 600 and the cover 800 may have certain appropriate shapes that can be non-directionally fastened to each other.

Referring to FIG. 8, the head 810 of the cover 800 according to an embodiment can be fitted in the indentation 610 of the coupling structure 600 without a gap when the cover 800 600 is fastened to the coupling structure 600. In this state, a flange 813 (e.g., the flange 413 shown in FIG. 4) can be in contact with the step portion 611 of the coupling structure 600. The step portion 611 can function as a supporter for the head 810 of the cover 800.

Accordingly, the cover 800 can be securely fastened to the coupling structure 600. In other words, the flange 813 may have a shape corresponding to the indentation 610 to be fitted in the indentation 610 without a gap when the cover 800 is fastened to the coupling structure 600. For example, when the indentation 610 has a substantially circular shape, the head 810 of the over 800 may also have a corresponding circular shape.

Figure 9:
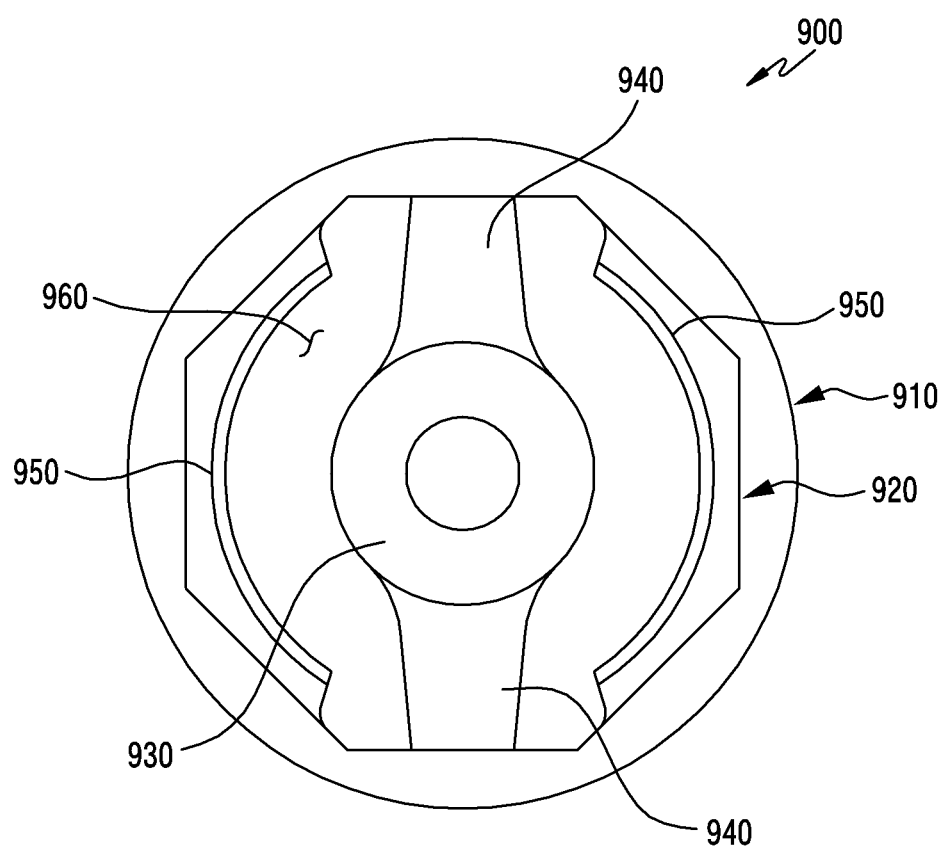
FIG. 9 is a plan view of a coupling structure according to another embodiment of the disclosure.

According to an embodiment, the cover 800 may have a shape protruding a predetermined gap 'g' from the housing 601 when the cover 800 is fastened to the coupling structure 600. For example, the head 810 of the cover 800 may have a dome shape, a cylindrical shape, or an embossing shape with a plurality of projections. Accordingly, the cover 800 prevents the housing 601 from directly coming in contact with a floor or a desk, so it is possible to prevent direct damage to the housing 601 and improve the heat dissipation rate of the electronic parts disposed in the housing 601. The head 810 of the cover 800 is made of a very flexible material, so it can absorb shock and provide an anti-slip and vibration-isolation function. Accordingly, the cover 800 may also be referred to as a supporter or an anti-slip pad FIG. 9 is a plan view of a coupling structure according to another embodiment of the disclosure. A coupling structure 900 shown in FIG. 9 may be at least partially similar to or the same as the coupling structure 600 shown in FIGS. 6 to 8, and the same configuration is not described here.

The coupling structure 900 according to various embodiments of the disclosure may have an indentation 910, an opening 920, a thread-fastening portion 930, bridges 940, and protrusions 950. The coupling structure 900 may have bridges 940 connecting the perimeter of the opening 920 and the thread-fastening portion 930. The number of the bridges 940 may be varied. For example, one bridge 940 can connect the perimeter of the opening 920 and the thread-fastening portion 930. As another example, as show in FIG. 9, two bridges 940 can connect the perimeter of the opening 920 and the thread-fastening portion 930. The two bridges 940 may be symmetrically disposed with the thread-fastening portion 930 therebetween. The two bridges 840 may be disposed at various angles with respect to each other. As another example, three bridges (e.g., the bridges 640 shown in FIG. 6) may be arranged at 120° with respect one another. An embodiment is not limited thereto and the number and the arrangement of the bridges 940 may be freely and appropriately determined. The protrusions 950 may protrude toward the thread-fastening portion 930 from the perimeter of the opening 920 not to overlap the bridges 940

According to an embodiment, the opening 920 may have a substantially circular shape. For example, the opening 920 may be an octagon in the embodiment shown in FIG. 9. Even though the opening 920 is not a complete circle, the insert (e.g., 820 in FIG. 8) of the cover can be accommodated regardless of the positions of the protrusions 950 and the bridges 940 between the thread-fastening portion 930 and the perimeter of the opening 920. Similarly, various components of the coupling structure 900 such as not only the opening 920 of the coupling structure, but also the indentation 910 and the thread-fastening portion 930 may have substantially circular shapes.

Figure 10:
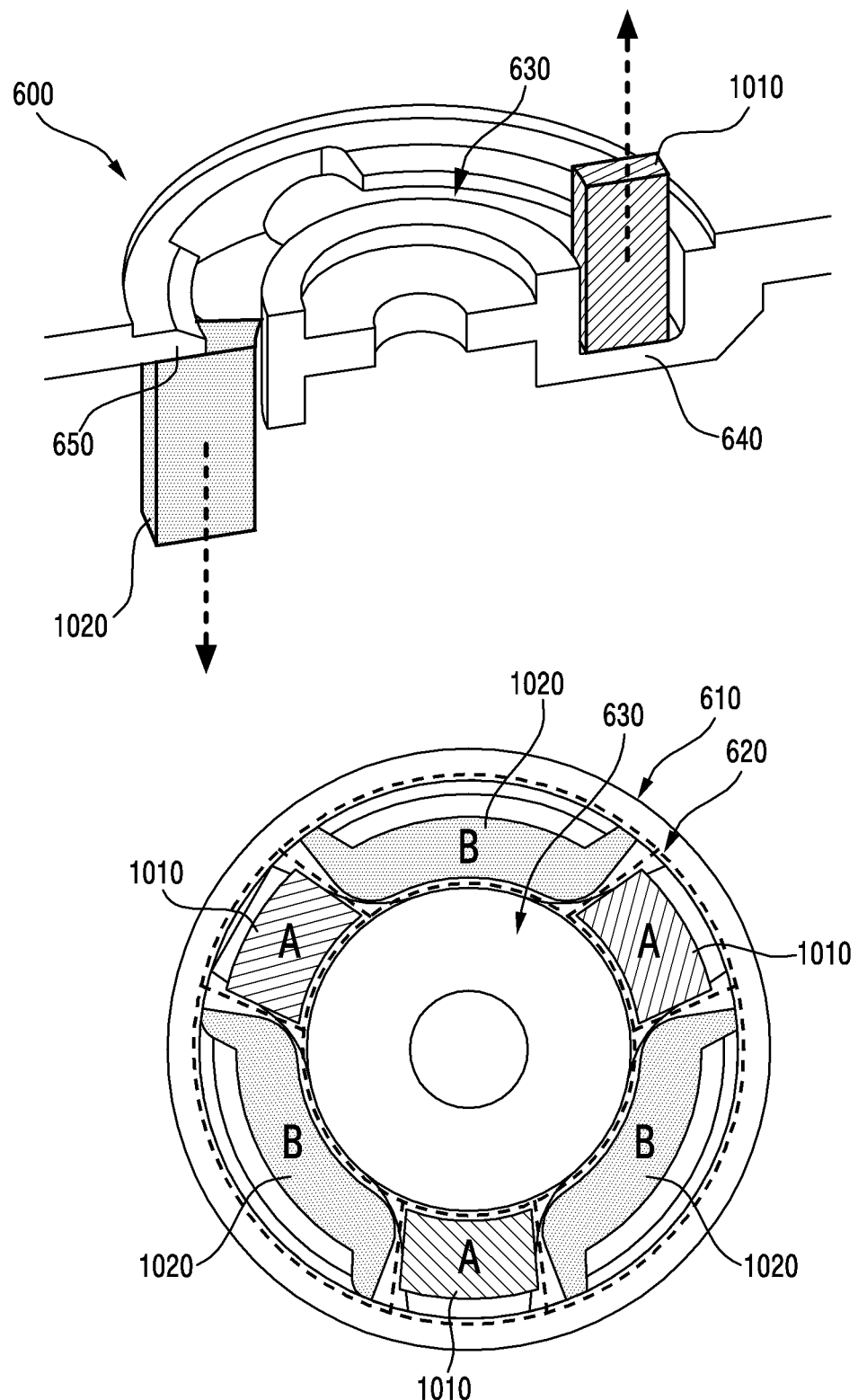
FIG. 10 shows a forming process of a coupling structure according to various embodiments of the disclosure.
Figure 11:
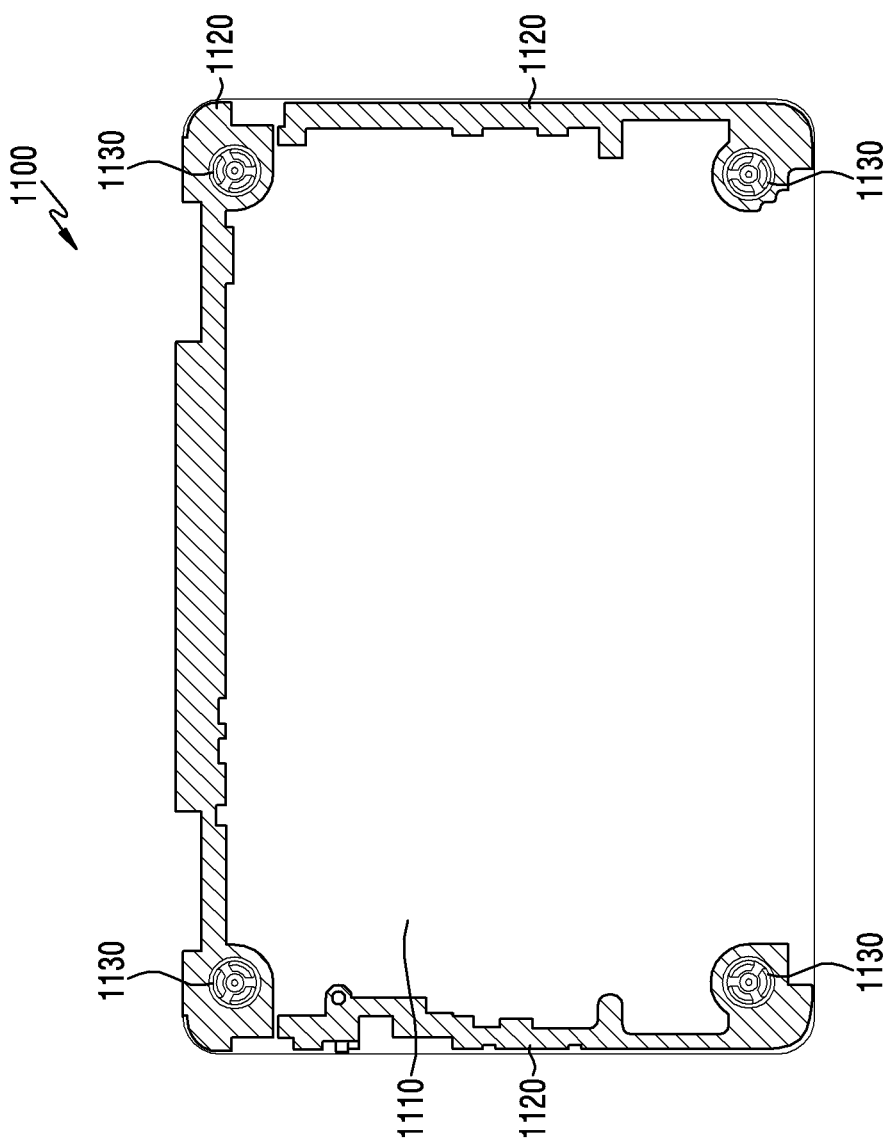
FIG. 11 shows another example of a housing according to various embodiments of the disclosure.

FIG. 10 shows a forming process of a coupling structure according to various embodiments of the disclosure. Referring to FIG. 10, the coupling structure 600 may be formed in injection molding of a housing (e.g., 320 in FIG. 3). The coupling structure 600 may have a structure in which the areas A of the bridges 640 and the areas B of the protrusions 650 do not overlap each other when seen from above. Accordingly, the coupling structure 600 can be formed by an upper core 1010 corresponding to the bridges 640 and a lower core 1020 corresponding to the protrusions 650. When the coupling structure 600 is designed such that the bridges 640 and the protrusion 650 partially overlap each other, an additional process (secondary process) may be further required to form an undercut (to which the hook of the cover can be caught) between the bridges 640 and the protrusions 650. For example, the undercut may be formed by directly cutting a predetermined portion after separate injection molding. The components of the coupling structure may not be integrally formed. For example, the undercut may be formed by separately forming the bridges or the protrusions and then attaching them. As a result, since the coupling structure 600 according to various embodiments of the disclosure has a structure in which the bridges 640 and the protrusions 650 do not overlap each other (in the substantially circular indentation 610), the coupling structure 600 can be manufactured through a simple manufacturing process in which forming is performed only injection molding that uses upper/lower cores FIG. 11 shows another example of a housing according to various embodiments of the disclosure. A coupling structure 1130 included in a housing 1100 shown in FIG. 11 may be at least partially the same as or similar to the coupling structure 600 shown in FIG. 6

Referring to FIG. 11, the housing 1100 may include a case member 1110 and an assembly member 1120 that defines substantially most of the external appearance. The case member 1110 and an assembly member 1120 may be made of different materials. For example, the case member 1100 may be made of a metal material. The metal material is generally formed by pressing, but the coupling structure (e.g., 1130) according to an embodiment of the disclosure may be difficult to manufacture through pressing. Accordingly, the coupling structure 1130 according to an embodiment of the disclosure is made of a polymer material and the assembly member 1120 including the coupling structure 1130 is separately formed and then coupled and fixed to the case member, thereby being able to provide the housing 1100 having a metallic external appearance.

Figure 12:
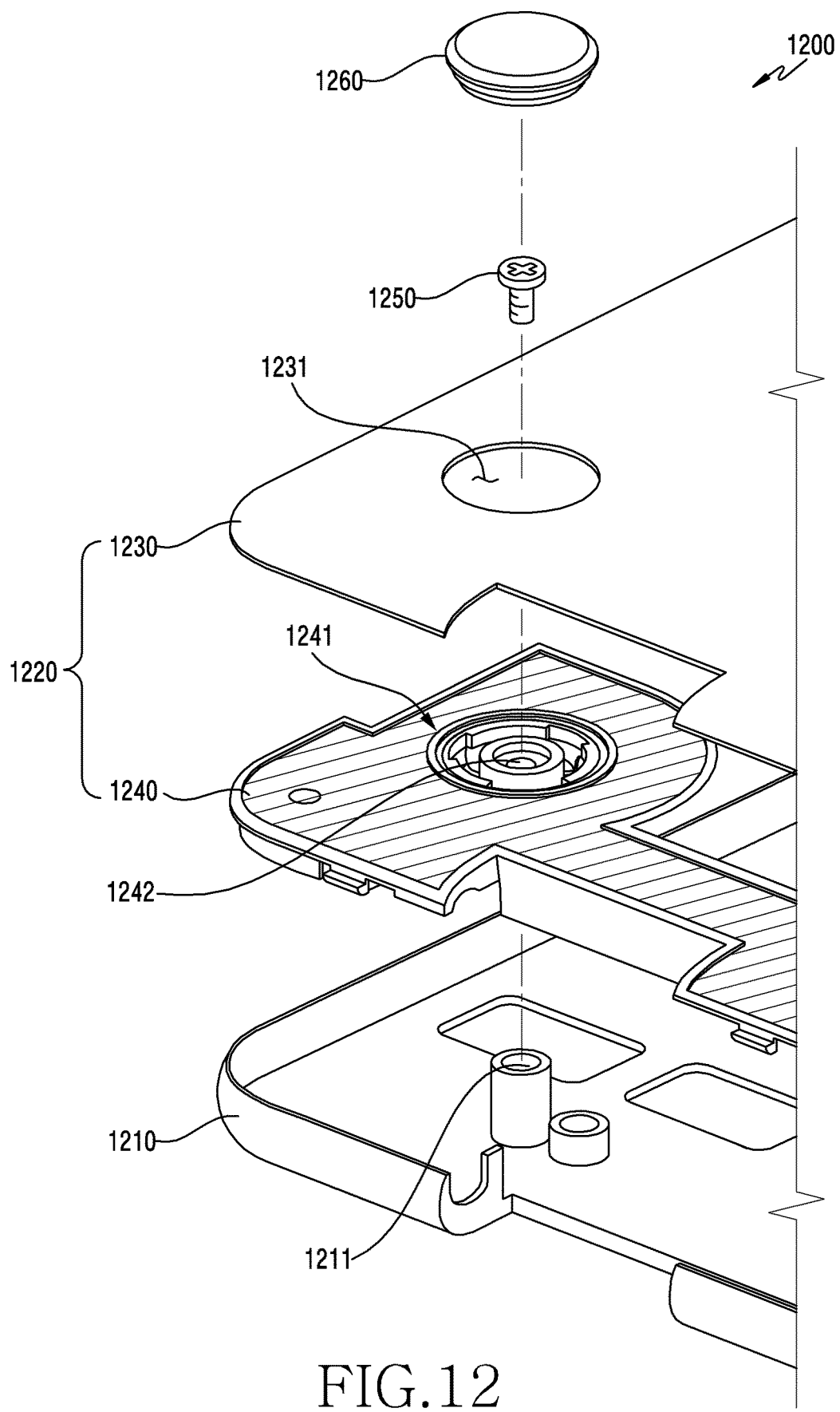
FIG. 12 is a partial exploded perspective view of an electronic apparatus including a coupling structure according to various embodiments of the disclosure.

FIG. 12 is a partial exploded perspective view of an electronic apparatus including a coupling structure according to various embodiments of the disclosure. A second housing 1220 shown in FIG. 12 may be the housing 1100 shown in FIG. 11

Referring to FIG. 12, a first housing 1210 and a second housing 1220 of an electronic apparatus 1200 may be fixed by a screw 1250. The first housing 1 may have at least one tapped hole 1211. The second housing 1220 may include a case member 1230 and an assembly member 1240. The assembly member 1240 may have a through-hole 1242 positioned to correspond to the tapped hole 1211 and a coupling structure 1241 having the through-hole 1242. The case member 1230 may have an opening 1231 formed to expose the coupling structure 1241 to the outside. The screw 1250 is fastened to the tapped hole 1211 through the through-hole 1242, thereby being able to fix the first housing 1210 and the second housing 1220 not to be disassembled. According to an embodiment, the case member 1230 and the assembly member 1240 of the second housing 1220 may be made of different materials. For example, the case member 1230 may be made of a metal material and the assembly member 1240 may be made of a polymer material. The second housing 1220 may be manufactured by separately forming and then attaching the case member 1230 and the assembly member 1240. However, embodiments are not limited thereto, and even if the case member 1230 and the assembly member 1240 are made of different materials, they may be formed at once through double-shot injection molding, etc.

Figure 13:
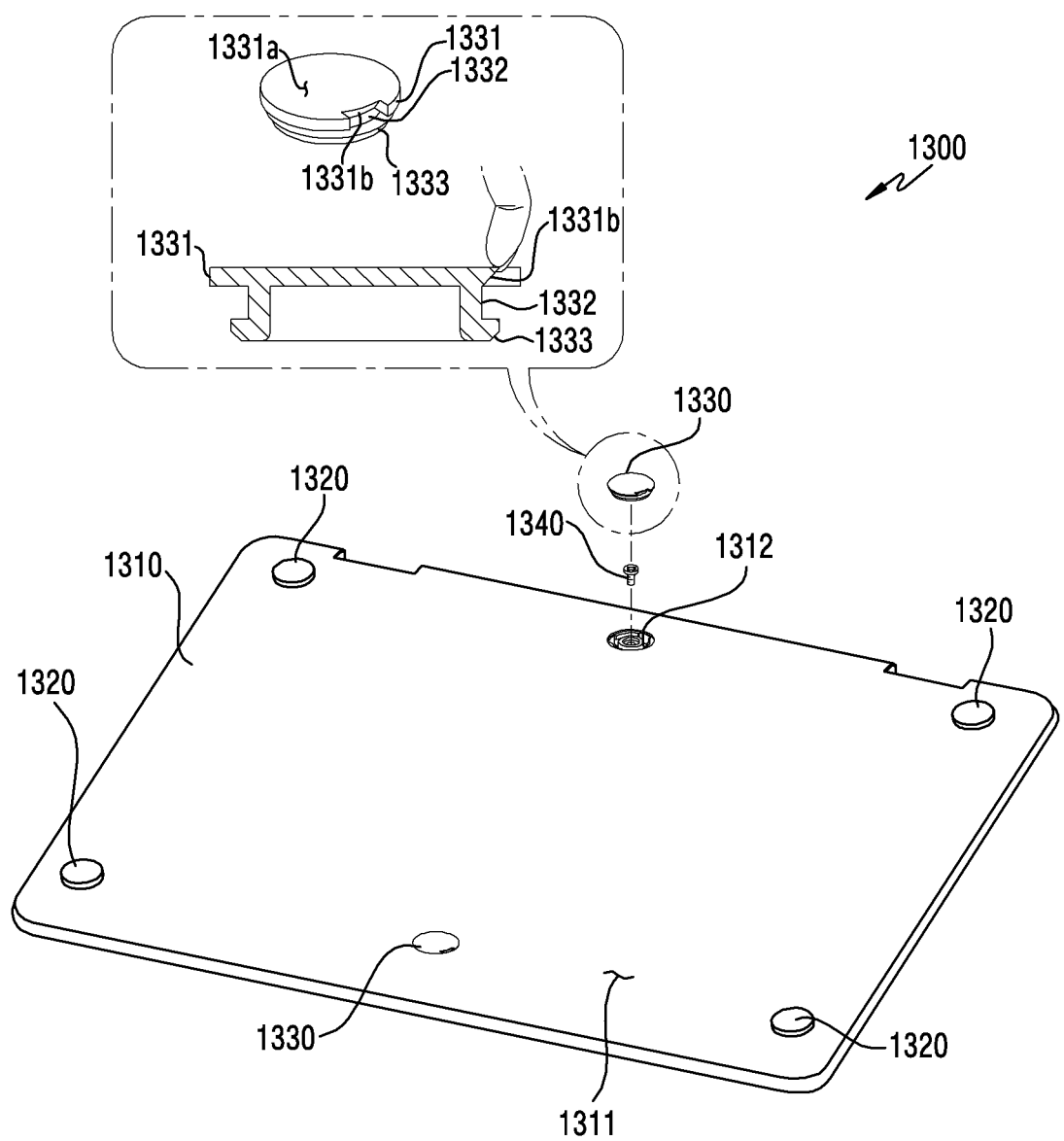
FIG. 13 shows another example of a cover according to various embodiments of the disclosure

FIG. 13 shows another example of a cover according to various embodiments of the disclosure Referring to FIG. 13, an electronic apparatus 1300 according to an embodiment may include a housing 1310 having a first cover 1320. The housing 1310 may be a rear housing (e.g., the second housing 240 show in FIG. 2) that faces a floor or a desk when the electronic apparatus 1300 is used. A first cover 1320 protrudes a predetermined height from the housing 1310, thereby being able to function as a supporter or an anti-slip pad. The first cover 1320 may be the same as the covers described above (e.g., the cover 340 shown in FIG. 3, the cover 400 shown in FIG. 4, the cover 500 shown in FIG. 5, or the cover 800 show in FIG. 8).

According to an embodiment, the housing 1310 further include a second cover 1330. The second cover 1330 may have a head 1331, an insert 1332, and a hook 1333. The second cover 1330, similar to the first cover 1320, can be fastened to the housing 1310 by a coupling structure 1312 (e.g., the coupling structure 600 shown in FIG. 6). The coupling structure 1312 can couple and fix the housing 1310 and a counterpart (e.g., the first housing 230 or the printed circuit board 250 shown in FIG. 2, or a bracket (not shown)) using a screw 1340. According to another embodiment, the coupling structure 1312 may be disposed in a separate case (e.g., a battery cover) included in the housing 1310. Embodiments are not limited thereto and the number and the position of the coupling structure 1312 may be freely and appropriately selected due to various reasons in terms of design such as structural firmness of the electronic apparatus 1300

According to an embodiment, the outer surface 1331*a* of the head 1331 of the second cover 1330 may be a shape that makes substantially the same plane as the outer surface 1311 of the housing 1310 when the second cover 1330 is fastened to the coupling structure 1312. For example, the outer surface 1331*a* of the head 1331 of the second cover 1330 may have a substantially plane shape or may be a certain appropriate shape following the external appearance of the housing 1310. The outer surface 1331*a* of the head 1331 of the second cover 1330 may be made of the same material as the housing 1310. Accordingly, the second cover 1330 covers the screw 1340 and is integrated with the housing 1310, thereby being able to provide aesthetic satisfaction to the external appearance of the electronic apparatus 1300.

According to an embodiment, the head 1331 of the second cover 1330 may be made of a material different from those of the insert 1332 and the hook 1333. The head 1331 of the second cover 1330 may be made of the same material (e.g., a polymer or metal) as the housing 1310, and the insert 1332 and the hook 1333 may be made of a flexible material (e.g., rubber). The head 1331, the insert 1332, and the hook 1333 of the second cover 1330 may be integrally formed through double-shot injection molding or may be separately formed and then attached to one another According to an embodiment, the head 1331 of the second cover 1330 may further have a catching groove 1331b. The catching groove 1331b can enables the second cover 1330 to be easily separated from the coupling structure 1312. For example, a user can separate the second cover 1330 from the coupling structure 1312 by applying a force in a separation direction to the second cover 1330 fastened to the coupling structure 1312 using the catching groove 1331b.

An electronic apparatus according to various embodiments of the disclosure may include: a housing configured to define an external appearance of the electronic apparatus; a cover configured to define at least a portion of the external appearance of the electronic apparatus in cooperation with the housing; and a coupling structure disposed on the housing and configured to detachably fasten the cover to the housing, in which the coupling structure has: an opening; a thread-fastening portion positioned at a center of the opening; a bridge connecting the thread-fastening portion and a perimeter of the opening; and at least one catching protrusion protruding toward the thread-fastening portion from the perimeter of the opening, in which the cover may have a hook configured to be caught on the at least one catching protrusion According to an embodiment, the catching protrusion may be formed in an area that is not an area where the bridge is formed, around the perimeter of the opening.

According to an embodiment, the catching protrusion may be disposed substantially at an upper end of the perimeter of the opening and the bridge may be disposed substantially at a lower end of the perimeter of the opening.

According to an embodiment, the housing, the thread-fastening portion, and the bridge may be integrally formed.

According to an embodiment, the cover has: a head; and a substantially cylindrical insert extending from the head, wherein the hook may be formed around an end of the insert According to an embodiment, the head may have a shape that protrudes a predetermined distance from an outer surface of the housing when the cover is fastened to the coupling structure.

According to an embodiment, the head may include a dome shape

According to an embodiment, the thread-fastening portion has a substantially circular shape and is positioned at the center of the opening, and the insert may have an inner space that accommodates the thread-fastening portion when the cover is fastened to the coupling structure According to an embodiment, the housing has a substantially circular indentation, the opening is formed inside the indentation and has a flange formed along an edge of the head, and the head may have a shape corresponding to the indentation so that the flange is be fitted in the indentation without a gap when the cover is fastened to the coupling structure.

According to an embodiment, the hook may have at least one slit around the end of the insert.

According to an embodiment, the flit enables the hook to be easily bent by the catching protrusion when the cover is fastened to the coupling structure.

According to an embodiment, the thread-fastening portion may further have a groove in which the head of the screw can be seated when the screw is fastened.

According to an embodiment, a counterpart may include at least one of another housing of the electronic apparatus or a printed circuit board mounted in a housing According to an embodiment, the hook and the catching protrusion may have chamfers in directions facing each other.

According to an embodiment, detachable fastening of the catching protrusion and the hook may include a snap-fit structure.

An electronic apparatus according to various embodiments of the disclosure may include: a printed circuit board; a front housing and rear housing configured to define an inner space in which the printed circuit board is mounted; and at least one coupling structure configured to couple the front housing and the rear housing, in which the coupling structure has: an indentation formed in a substantially circular shape on the rear housing; a through-hole positioned at a center of the indentation; at least one opening formed along a perimeter of the indentation; and at least one catching protrusion protruding from the perimeter of the indentation toward the at least one opening, and has: a screw passing through the through-hole and configured to fix the front housing and the rear housing by being fastened to a tapped hole positioned to correspond to the through-hole in the front housing; and a hook configured to be detachably engaged with the at least one catching protrusion.

According to an embodiment, the cover may have: a head having a shape corresponding to the indentation; and a cylindrical insert extending from the head, in which the hook may be formed around a perimeter of the insert According to an embodiment, the head of the cover may have a shape that partially protrudes from an outer surface of the rear housing when the cover is fastened to the coupling structure According to an embodiment, the head has a flange formed an edge, and the flange may have a shape that corresponds to the indentation to be fitted in the indentation without a gap when the cover is fastened to the coupling structure According to an embodiment, the head may be made of the same material as the rear housing to make a substantially the same plane with an outer surface of the rear housing, and may have a groove configured such that a user can apply a force in a direction in which the cover fastened to the coupling structure is separated. [97] The various example embodiments disclosed herein and illustrated in the drawings are provided by way of illustration and are not intended to limit the scope of the present disclosure. Therefore, all changes or modifications derived from the technical idea of the present disclosure as well as the embodiments described herein should be understood to fall within the scope of the present disclosure.

The invention claimed is:
1. An electronic apparatus comprising:
a housing configured to define an external appearance of the electronic apparatus;

a cover configured to define at least a portion of the external appearance of the electronic apparatus in cooperation with the housing; and a coupling structure disposed on the housing and configured to detachably fasten the cover to the housing, wherein the coupling structure includes:

an opening;

a perimeter surface corresponding to a perimeter of the opening;

a thread-fastening portion positioned at a center of the opening;

a bridge connecting a portion of the thread-fastening portion and a first portion of the perimeter surface; and at least one catching protrusion protruding toward the thread-fastening portion from the perimeter surface, wherein the at least one catching protrusion is formed at a second portion distinguished from the first portion of the perimeter surface, and the at least one catching protrusion and the bridge are not overlapped when seen above, wherein the cover includes a hook configured to be caught on the at least one catching protrusion, and wherein the hook surrounds a perimeter of the thread-fastening portion of the coupling structure with having a gap between the hook and the thread-fastening portion.

2. The electronic apparatus of claim 1, wherein the catching protrusion is disposed substantially at an upper end of the perimeter surface and the bridge is disposed substantially at a lower end of the perimeter surface.

3. The electronic apparatus of claim 1, wherein the housing, the thread-fastening portion, and the bridge are integrally formed.

4. The electronic apparatus of claim 1, wherein the cover includes:

a head; and a substantially cylindrical insert extending from the head, wherein the hook is formed around an end of the insert.

5. The electronic apparatus of claim 4, wherein a portion of the head protrudes from an outer surface of the housing when the cover is fastened to the coupling structure.

6. The electronic apparatus of claim 5, wherein the head includes a dome shape.

7. The electronic apparatus of claim 4, wherein the thread-fastening portion has a substantially circular shape and is positioned at the center of the opening, and the insert includes an inner space that accommodates the thread-fastening portion when the cover is fastened to the coupling structure.

8. The electronic apparatus of claim 4, wherein the housing includes a substantially circular indentation, the opening is formed inside the indentation, the head includes a flange formed along an edge thereof, and the head has a shape corresponding to the indentation so that the flange is be fitted to the indentation without a gap when the cover is fastened to the coupling structure.

9. The electronic apparatus of claim 4, wherein the hook includes at least one slit around the end of the insert.

10. The electronic apparatus of claim 9, wherein the slit is configured to enable the hook to be easily bent by the catching protrusion when the cover is assembled to the coupling structure.

11. The electronic apparatus of claim 1, further comprising a screw;

wherein the screw passes through a through-hole formed in the thread-fastening portion, and is fastened to a tapped hole formed in a counterpart, and the thread-fastening portion further includes a groove receiving a head of the screw when the screw is assembled to the thread-fastening portion.

12. The electronic apparatus of claim 11, wherein the counterpart includes at least one of another housing of the electronic apparatus or a printed circuit board mounted in the housing.

13. The electronic apparatus of claim 1, wherein the hook and the catching protrusion have chamfers in directions facing each other.

14. The electronic apparatus of claim 1, wherein detachable fastening of the catching protrusion and the hook includes a snap-fit structure.

* * * * *